United States Patent [19]

Bhattacharyya et al.

[11] Patent Number: 5,475,565
[45] Date of Patent: Dec. 12, 1995

[54] POWER DISTRIBUTION LID FOR IC PACKAGE

[75] Inventors: Bidyut K. Bhattacharyya, Chandler; J. D. Wilson, Phoenix, both of Ariz.

[73] Assignee: Intel Corporation, Santa Clara, Calif.

[21] Appl. No.: 253,668

[22] Filed: Jun. 3, 1994

[51] Int. Cl.$^6$ .................................................. H05K 7/20
[52] U.S. Cl. .................... 361/719; 257/713; 361/306.2; 361/707; 361/761
[58] Field of Search ................................. 361/704, 705, 361/707–711, 717–719, 761, 763, 764, 767, 778, 792, 794, 306.1, 306.2, 306.3, 321.2; 165/80.3, 185; 194/52.1, 52.4; 257/704, 707, 713, 723, 724, 700

[56] References Cited

U.S. PATENT DOCUMENTS

| | | | |
|---|---|---|---|
| 3,880,493 | 4/1975 | Lockhart, Jr. | 339/147 R |
| 4,249,196 | 2/1981 | Durney | 357/74 |
| 4,654,694 | 3/1987 | Val | 357/74 |
| 4,739,448 | 4/1988 | Rowe | 361/386 |
| 4,982,311 | 1/1991 | Dehaine | 361/388 |
| 5,095,402 | 3/1992 | Hernandez | 361/306 |
| 5,212,402 | 5/1993 | Higgins, III | 257/532 |
| 5,272,590 | 12/1993 | Hernandez | 361/306.2 |

*Primary Examiner*—Gerald P. Tolin
*Attorney, Agent, or Firm*—Blakely, Sokoloff, Taylor & Zafman

[57] ABSTRACT

An electronic package for an integrated circuit. The integrated circuit is mounted to a heat spreader that is attached to a substrate. The heat spreader is thermally conductive and lowers the thermal impedance of the package. The heat spreader may also provide a return current path from the integrated circuit to the substrate. The substrate has internal power and signal lines that are coupled to the integrated circuit. The power and signal lines are connected to surface pads or leads that can be mounted to an external printed circuit board. Mounted to an inner area of the integrated circuit is a decoupling capacitor. The decoupling capacitor is also connected to a lid that is mounted to the substrate. The decoupling capacitor reduces the noise within the integrated circuit and is used to control the impedance of the overall package. The lid contains both power and ground planes that are connected to the capacitor and the power/ground pins of the substrate.

13 Claims, 2 Drawing Sheets

POWER DISTRIBUTION LID FOR IC PACKAGE

BACKGROUND OF THE INVENTION

1. Field of the Invention

The present invention relates to an electronic package for integrated circuits.

2. Description of Related Art

Integrated circuits (ICs) are typically housed within a ceramic or plastic package. The package has surface pads or leads that are soldered to corresponding pads or holes of a printed circuit board. The printed circuit board may have a number of IC packages and a connector which is plugged into a motherboard. The integrated circuits typically receive power from a power supply that is also plugged into the motherboard.

Electrical noise may exist on the power delivered to the integrated circuit, because, amongst other things, of an impedance mismatch between the printed circuit board and the package. Electrical noise can disturb the operation of the IC. Noise is particularly troublesome for high speed devices such as a microprocessor. The impedance of the printed circuit board can be varied by adding passive capacitors, inductors and resistors to the surface of the board. Mounting additional elements occupies valuable board space and increases both the complexity and cost of producing the board assembly. It would therefore be desirable to provide an electronic package that will reduce the noise of power that is delivered to the package.

Devices which switch at high speeds can create internal inductive effects that disturb the operation of the circuit. Internal IC noise can be reduced by coupling a capacitor to the device. Decoupling capacitors typically have a high capacitance and are relatively large in size. Large capacitors are typically too big to incorporate into the integrated circuit. It would therefore be desirable to provide an electronic package that contains a decoupling capacitor which is connected to the integrated circuit of the package.

Large integrated circuits such as a microprocessor can generate over 20 watts of heat. The thermal impedance of the package must be low enough to ensure that the junction temperatures of the integrated circuit are within safe operating limits. Heat sinks are sometimes incorporated into electronic packages to reduce the thermal impedance of the package. It would be desirable to provide a low cost electronic package which contains a heat sink, a decoupling capacitor for the integrated circuit and means for reducing the noise of power provided to the IC.

SUMMARY OF THE INVENTION

The present invention is an electronic package for an integrated circuit. The integrated circuit is mounted to a heat spreader that is attached to a substrate. The heat spreader is thermally conductive and lowers the thermal impedance of the package. The heat spreader may also provide a return current path from the integrated circuit to the substrate. The substrate has internal power and signal lines that are coupled to the integrated circuit. The power and signal lines are connected to surface pads or leads that can be mounted to an external printed circuit board.

Mounted to an inner area of the integrated circuit is a decoupling capacitor. The decoupling capacitor is also connected to a lid that is mounted to the substrate. The decoupling capacitor reduces the noise within the integrated circuit and is used to control the impedance of the overall package. The lid contains both power and ground planes that are connected to the capacitor and the power/ground pins of the substrate. The conductive planes of the lid lower the impedance of the package and reduce the amount of noise within the power delivered to the integrated circuit.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
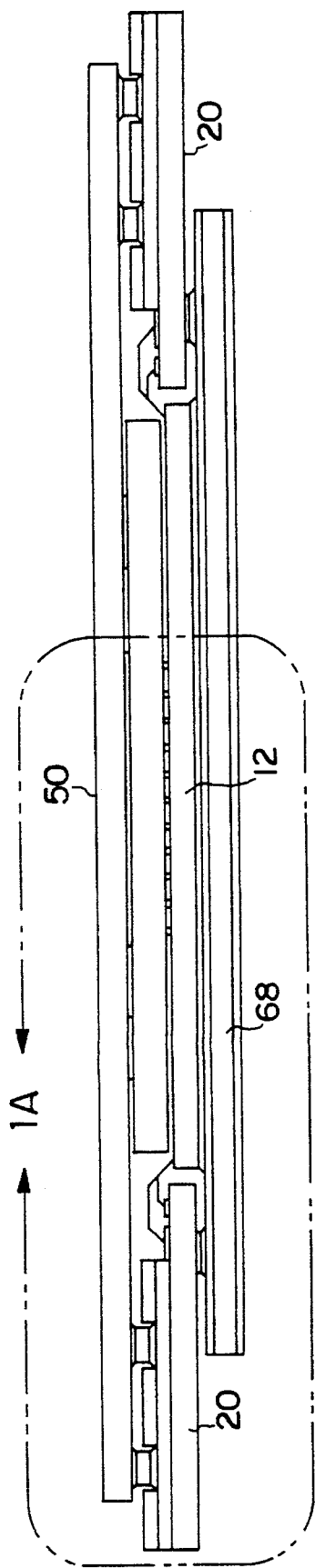
FIG. 1 is a cross-sectional view of an electronic package of the present invention.
Figure 2:
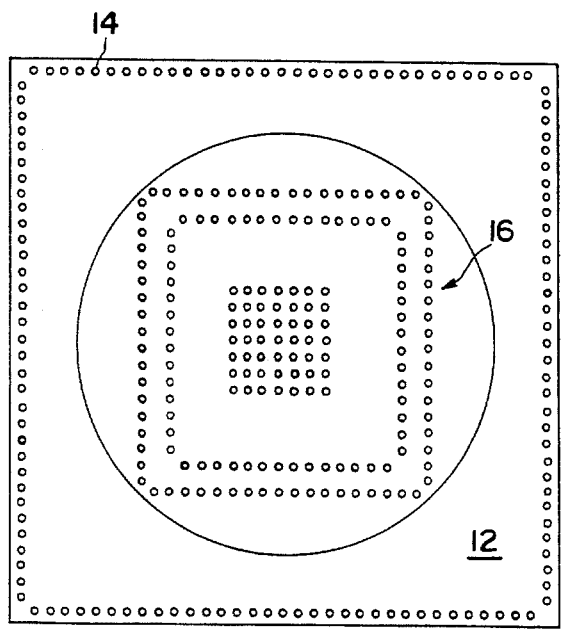
FIG. 2 is a top view of an integrated circuit.

Referring to the drawings more particularly by reference numbers, FIG. 1 is an electronic package 10 of the present invention. The package 10 contains an integrated circuit 12. The integrated circuit 12 may be any electronic device including but not limited to a microprocessor. As shown in FIG. 2, the integrated circuit 12 has a plurality of outer surface pads 14 around the periphery of the IC die. The integrated circuit also has a plurality of inner surface pads 16 located within an inner portion of the die. The surface pads 14 and 16 provide the input and output pins for the integrated circuit. Both power and digital signals are communicated through the outer surface pads 14. The inner pads 16 are typically dedicated to power. The integrated circuit 12 may also have a plurality of surface pads (not shown) located on the opposite bottom surface of the die. The bottom pads may provide a current return path for the circuit.

Referring to FIG. 1, the outer surface pads 14 of the integrated circuit are connected to the inner surface pads 18 of a substrate 20 by wires 22. The inner surface pads 18 are typically within a shelf 24. The circuit 12 may be coupled to the substrate 20 with wire bonding techniques, TAB (tape automated bonding) tape or any other conventional means for coupling the pads 14 and 18. The substrate 20 is preferably constructed from a ceramic material which has a plurality of internal conductive lines 26. The conductive lines 26 are coupled to external surface pads or leads (not shown) that can be soldered to an external printed circuit board. Some of the lines 26 are connected to the inner surface pads 18 and coupled to the integrated circuit 12 through wires 22. Although a ceramic substrate 22 is described and shown, it is to be understood that the substrate can be constructed from another material such as a molded plastic, wherein the conductive lines are part of a lead frame.

The integrated circuit 12 is connected to a decoupling capacitor 28. In the preferred embodiment, the capacitor 28 is connected to the integrated circuit 12 by conductive balls 30. The balls 30 are typically a solder composition and mounted to the integrated circuit 12 with conventional techniques. The solder balls 30 are reflowed to attach the capacitor 28 to the die 12.

Figure 3:
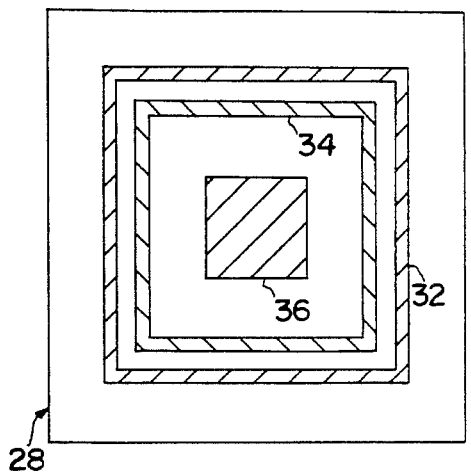
FIG. 3 is a bottom view of a decoupling capacitor.
Figure 4:
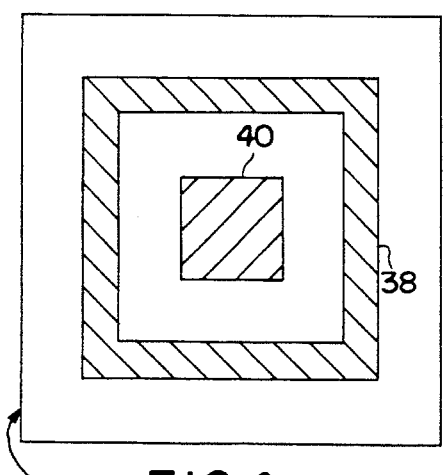
FIG. 4 is a top view of the decoupling capacitor of FIG. 3.

As shown in FIG. 3, the capacitor 28 has conductive layers 32–36 that are arranged in rectangular patterns that correspond to the inner surface pads 16 of the integrated circuit 12. Layers 32 and 36 are typically dedicated to power, layer 34 is typically dedicated to ground. In the preferred embodiment, the layers 32–36 are tin plated to provide a wicking surface for the solder balls 30. As shown in FIG. 4, the capacitor 28 also has a pair of conductive layers 38 and 40.

Referring to FIG. 1, the layers 32–36 are coupled to layers 38–40 by vias 42 that extend through the capacitor 28. The capacitor 28 preferably has a plurality of conductive layers 44 interconnected by the vias 42 and separated by layers of dielectric material 46. The numerous layers reduce the inductance and increase the capacitance of the capacitor 28. The capacitor 28 can be connected to the integrated circuit 12 to reduce the noise of any power or digital signal coupled to the device 28. In the preferred embodiment, the capacitance of the capacitor is typically greater than 100 nanoFarads (nF).

Figure 5:
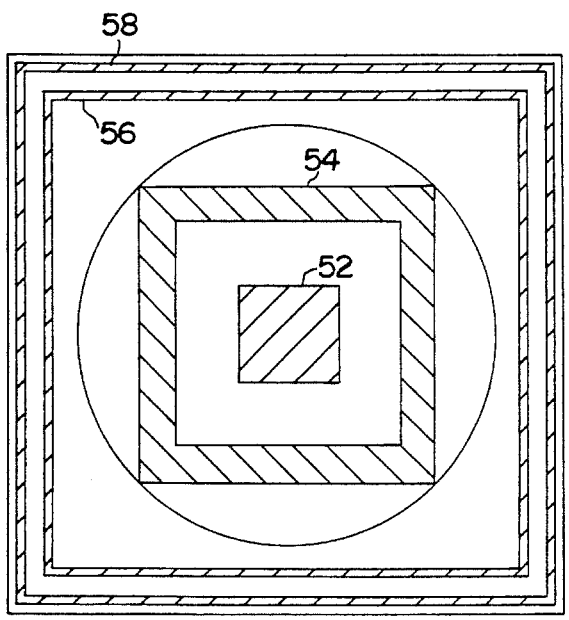
FIG. 5 is a bottom view of a lid.

The package 10 includes a lid 50 that is connected to the capacitor 28 and mounted to the substrate 20. As shown in FIG. 5, the lid 50 has a pair of inner conductive planes 52 and 54, and a pair of outer conductive planes 56 and 58. The inner conductive planes 52–54 are connected to the conductive layers 38–40 of the capacitor 28.

Figure 1A:
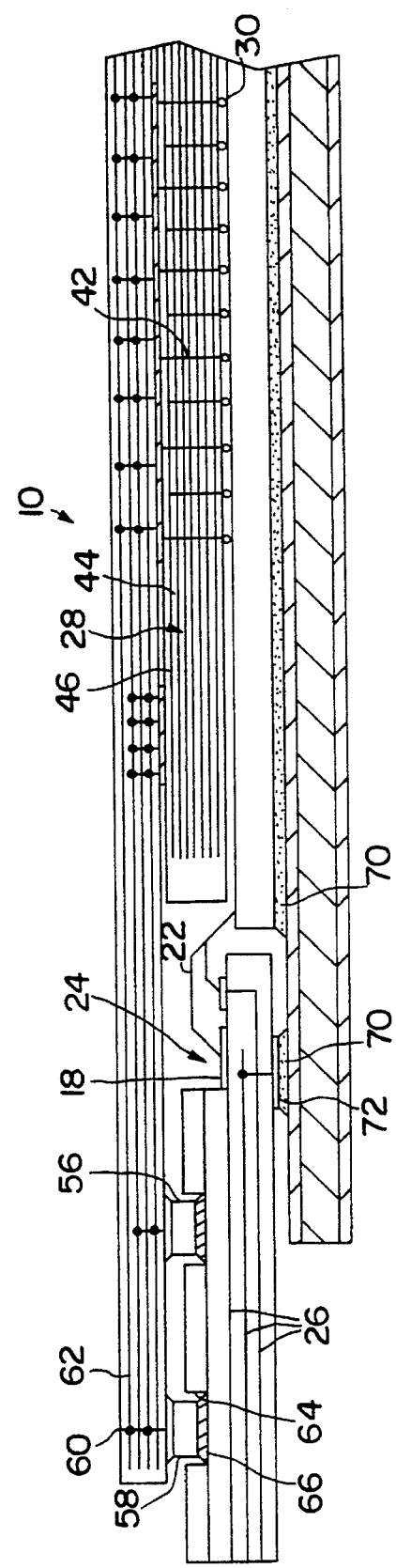
FIG. 1A is an enlarged sectional view of the package shown in FIG. 1.

As shown in FIG. 1A, the inner conductive planes 52–54 and outer conductive planes 56–58 are coupled together by internal vias 60 and conductive layers 62 of the lid 50. The conductive layers 62 are typically separated by layers of dielectric material. The outer conductive layers 56–58 extend into corresponding grooves 64 of the substrate 20. Within the grooves 64 are surface pads 66 that are connected to the corresponding internal substrate layers 26.

The conductive layers 54 and 56 of the lid 50 are typically dedicated to Power and coupled to corresponding Power pins of the substrate 20 through the surface pads 66 and the internal layers 26. Likewise, layers 52 and 58 are typically dedicated to Ground and corresponding pins of the substrate 20. The conductive layers 52–58 of the lid 50 provide power distribution planes which lower the inductance and resistance between the substrate pins and the die 12. In the preferred embodiment, the lid 50 has layers 62 dedicated to Power and layers dedicated to Ground.

The package 10 may further include a heat spreader 68 that is attached to both the integrated circuit 12 and the substrate 20. The heat spreader 68 is preferably constructed from a thermally conductive material such as copper. The heat spreader 68 can be mounted to a heat sink to improve the thermal efficiency of the package. The low thermal resistance of the heat spreader 68 reduces the thermal impedance of the package 10 and the junction temperatures of the IC 12.

The integrated circuit die 12 is preferably mounted to the heat spreader 68 by a thermally and electrically conductive adhesive 70. The spreader 68 may be connected to surface pads 72 located on the bottom of the substrate 20. The bottom surface pads 72 are coupled to the internal layers 26 of the substrate and provide a current return path from the circuit 12 to the pins of the package 10.

To assemble the package 10, the heat spreader 68 is braced onto the substrate 20. The die 12 is then mounted to the heat spreader 68. The outer surface pads 14 of the integrated circuit are coupled to the surface pads 18 of the substrate by wires 22. Solder balls 30 are placed onto the inner surface pads 16 of the die 12.

In a separate operation, the lid 50 is attached to the capacitor 28 by brazing together the conductive layers 38–40 to layers 54–52. The lid and capacitor sub-assembly is then solder reflowed simultaneously to the substrate 20 and die 12. Layers 56–58 of the lid 50 are solder attached to the substrate 20 through surface pads 66. Layers 32–36 of the capacitor 28 are solder attached to the solder balls 30 of the die 12. The soldering of the lid to the substrate provides a hermetic seal of the integrated circuit 12.

The present invention provides an inexpensive thermally efficient electronic package, that reduces the impedance and noise within the package.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a substrate;

an integrated circuit electrically connected to said substrate;

a lid that is mounted to said substrate and encloses said substrate, said lid having a conductive plane; and, a capacitor that is attached to and located between said lid and said integrated circuit, said capacitor being electrically connected to said conductive plane of said lid and said integrated circuit.

2. The electronic package as recited in claim 1, further comprising a heat spreader mounted to said substrate and said integrated circuit.

3. The electronic package as recited in claim 1, wherein said capacitor is constructed from a plurality of conductive layers separated by a plurality of dielectric layers.

4. The electronic package as recited in claim 1, wherein said lid has a ground plane and a separate power plane.

5. The electronic package as recited in claim 1, wherein said lid has a plurality of conductive layers separated by a plurality of dielectric layers.

6. The electronic package as recited in claim 1, wherein said capacitor is mounted to said lid by a pair of rectangular shaped surface pads.

7. The electronic package as recited in claim 6, wherein said capacitor is mounted to said integrated circuit by a plurality of conductive balls arranged in a plurality of concentric rectangles.

8. The electronic package as recited in claim 2, wherein said heat spreader is electrically mounted to a plurality of pads of said integrated circuit.

9. An electronic package, comprising:

a substrate having a plurality of conductive lines;

a heat spreader coupled to said substrate;

an integrated circuit that has a plurality of inner surface pads and a plurality of outer surface pads coupled to said conductive lines of said substrate;

a lid mounted to said substrate, said lid having an inner power plane and an inner ground plane, and further having an outer power plane and an outer ground plane coupled to said conductive lines of said substrate; and, a capacitor coupled to said inner surface pads of said integrated circuit and said inner planes of said lid.

10. The electronic package as recited in claim 9, wherein said capacitor is coupled to said integrated circuit by a plurality of conductive balls arranged in a plurality of concentric rectangles.

11. The electronic package as recited in claim 10, wherein said heat spreader is electrically coupled to a plurality of pads of said integrated circuit and said conductive lines of said substrate.

12. The electronic package as recited in claim 11, wherein said capacitor is constructed from a plurality of conductive layers separated by a plurality of dielectric layers.

13. The electronic package as recited in claim 12, wherein said lid has a plurality of conductive layers separated by a plurality of dielectric layers.

* * * * *

UNITED STATES PATENT AND TRADEMARK OFFICE
CERTIFICATE OF CORRECTION

PATENT NO. : 5,475,565
DATED : December 12, 1995
INVENTOR(S) : Bhattacharyya et al.

It is certified that error appears in the above-identified patent and that said Letters Patent is hereby corrected as shown below:

In column 2 at line 58 delete "substrate 22" and insert --substrate 20--

Signed and Sealed this

Twenty-sixth Day of November 1996

Attest:

BRUCE LEHMAN

Attesting Officer

Commissioner of Patents and Trademarks